(12) United States Patent
Sze et al.

(10) Patent No.: US 7,008,815 B1
(45) Date of Patent: Mar. 7, 2006

(54) METHOD OF MANUFACTURING A SELF-ALIGNED GUARD RING OF A PHOTO DIODE

(75) Inventors: Jhy-Jyi Sze, Tai-Nan (TW); Ming-Yi Wang, Taipei Hsien (TW); Junbo Chen, Tai-Chung Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/711,780

(22) Filed: Oct. 5, 2004

(51) Int. Cl.
*H01L 21/00* (2006.01)
(52) U.S. Cl. .................. 438/57; 438/320; 438/328
(58) Field of Classification Search .............. 438/45, 438/57, 91, 320, 328, 353
See application file for complete search history.

(56) References Cited

U.S. PATENT DOCUMENTS

| | | | | |
|---|---|---|---|---|
| 5,596,186 A | * | 1/1997 | Kobayashi | 250/214.1 |
| 6,384,462 B1 | * | 5/2002 | Pauchard et al. | 257/461 |

* cited by examiner

*Primary Examiner*—Phuc T. Dang
(74) *Attorney, Agent, or Firm*—Winston Hsu

(57) ABSTRACT

A method of manufacturing a self-aligned guard ring of a photo diode. The method includes defining a photo diode region on a semiconductor substrate and an isolation matter surrounding the photo diode region, forming a photo sensor in the photo diode region, covering a first mask on the photo sensor, forming a spacer around the first mask, covering a second mask on an edge of the isolation matter, and utilizing the first mask, the second mask, and the spacer to form a self-aligned guard ring surrounding the photo sensor.

25 Claims, 12 Drawing Sheets

METHOD OF MANUFACTURING A SELF-ALIGNED GUARD RING OF A PHOTO DIODE

BACKGROUND OF INVENTION

1. Field of the Invention

The present invention relates to a method of manufacturing a self-aligned guard ring of a photo diode.

2. Description of the Prior Art

A photo diode is a semiconductor device comprising a photoconductivity cell and a junction diode, and is commonly used in photoelectric products, such as cameras and photo sensor devices in scanners. A light-induced current of the photo diode represents a signal, whereas a current present in an absence of light represents noise. The photo diode processes signal data by using a magnitude of a signal-to-noise ratio. In the semiconductor industry, it is often desirable to increase the light-induced current of the photo diode so as to increase the signal-to-noise ratio, and hence to enhance a contrast of the signal. A sensitivity of the photo diode is enhanced and the quality of the photo diode is improved.

Please refer to FIG. 1. FIG. 1 is a schematic diagram of a photo diode 30 according to the prior art. The semiconductor wafer 10 includes a silicon substrate 12, and a P-well 14 set on the silicon substrate 12. The photo diode 30 includes a photo sensor 16 set on the surface of the P-well 14. Additionally, the semiconductor wafer 10 includes an isolation layer 18 set on the surface of the silicon substrate 12. The isolation layer 18 surrounds the photo sensor 16 and serves as an insulating material to prevent short-circuiting between the photo sensor 16 and other units.

According to the prior art method of forming the photo sensor 16 of the photo diode 30, an ion implantation process is performed to form an N-type doped region 20 on the surface of the P-well 14. Arsenic (As), with an energy of about 80 KeV and a dosage of about $10^{15}$ion/cm$^2$, is used as a major dopant in the ion implantation process. A depletion region 22 for detecting the leakage current is formed along the PN junction between the doped region 20 and the adjacent P-type well 14. In FIG. 1, the area marked with cross-hatching illustrates the depletion region 22.

In the formation of the photo diode 30 according to the prior art, dopants with an energy of about 80 KeV used in the ion implantation process not only create a deeper PN junction depth, but also damage a crystal structure on a surface of the photo sensor 16. Thus, more dark current (that is, current in the absence of light) is generated at the interface between the P-well 14 and the doped region 20 below the isolation layer 18. As a result, the signal-to-noise ratio and the sensitivity of the photo diode 30 are reduced.

SUMMARY OF INVENTION

The purpose of the present invention provides a method of manufacturing a self-aligned guard ring of a photo diode to improve the quality of the photo diode.

According to the purpose of the present invention, a preferred embodiment of the present invention provides a semiconductor substrate, at least a photo diode region defined on the surface of the semiconductor substrate, and an isolation matter surrounding the photo diode region. A photo sensor mask is formed on the surface of the semiconductor substrate, and utilizes the photo sensor mask as a block to perform a first ion implantation process to create a photo sensor. Furthermore, a first mask is formed on the photo sensor, and then the photo sensor mask is removed. A spacer is formed around the first mask, and a second mask is formed on the isolation matter edge. The first mask, spacer, and second mask are used as a block to perform a second ion implantation process to create a self-aligned guard ring surrounding the photo sensor, and then the first mask, spacer, and second mask are removed.

Another preferred embodiment of the present invention provides a semiconductor substrate, at least a photo diode region defined on the surface of the semiconductor substrate, and an isolation matter surrounding the photo diode region. A first mask is formed on the surface of the semiconductor substrate, and a spacer is formed around the first mask. The first mask and spacer are used as a block to perform a first ion implantation process to create a photo sensor. Furthermore, the spacer is removed and a second mask is formed on the surface of the semiconductor substrate that is not covered by the first mask, and then the first mask is removed. A third mask is formed on the isolation matter edge. The second mask and third mask are used as a block to perform a second ion implantation process to create a self-aligned guard ring surrounding the photo sensor, and then the second mask and third mask are removed.

Since the present invention utilizes the abovementioned self-aligning technique to manufacture the photo diode guard ring, it is useful in terms of size reduction of the semiconductor circuit. The self-aligned guard ring of the present invention further includes three advantages: 1) Capable of avoiding contact between the depletion region and the high stress and high defect density region. 2) Decreasing the dark current to increase the photo sensor sensitivity of the photo diode. 3) Increasing the characteristic uniformity of each photo diode.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
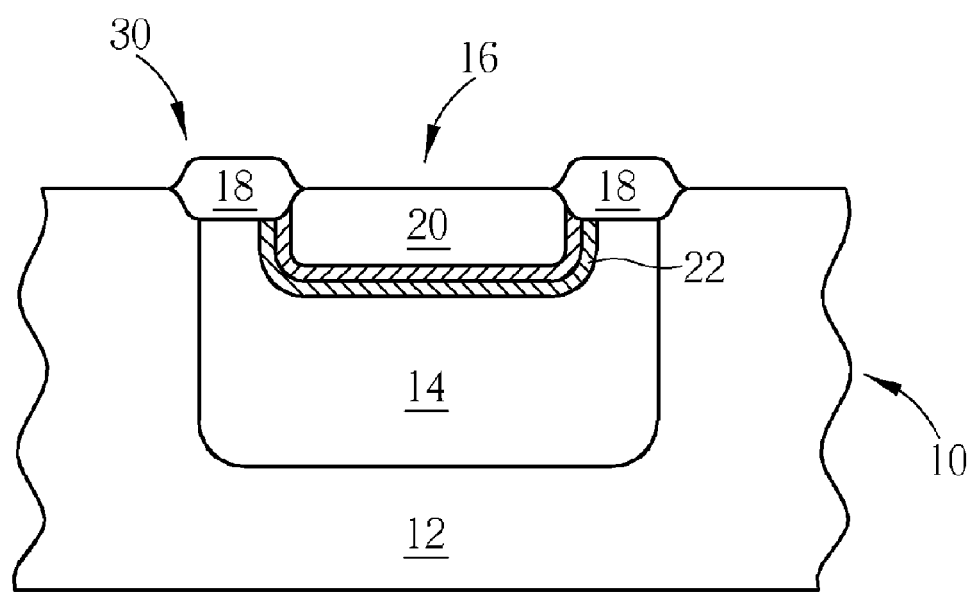
FIG. 1 is a schematic diagram of a photo diode according to the prior art.
Figure 2:
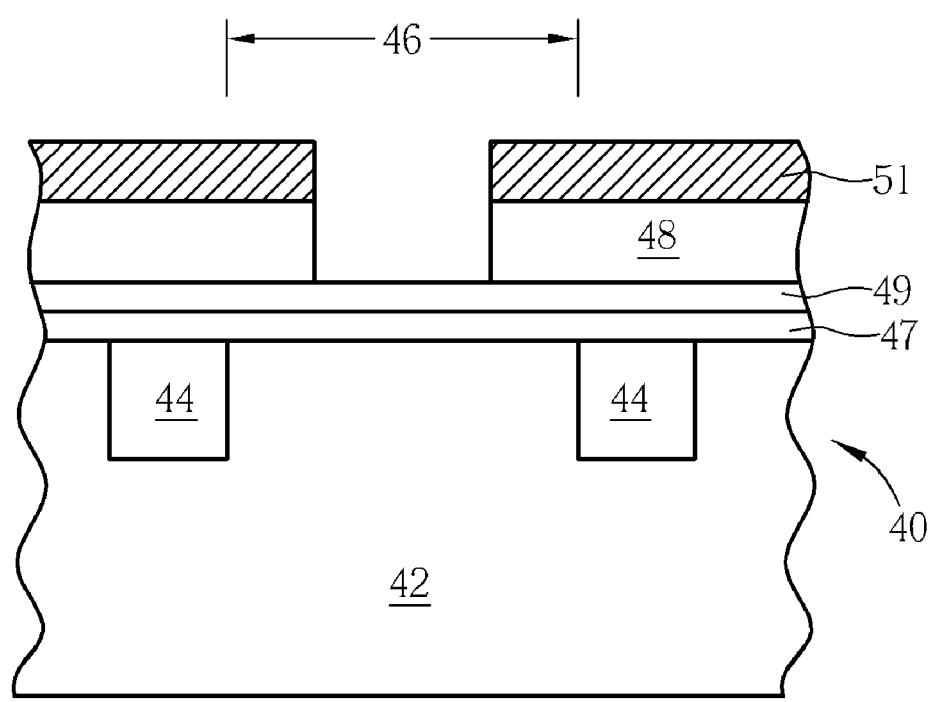
FIG. 2 to FIG. 6 are schematic diagrams for illustrating a method of forming a self-aligned guard ring of a photo diode according to a first embodiment of the present invention.

Please refer to FIG. 2 to FIG. 6. FIG. 2 to FIG. 6 are schematic diagrams for illustrating a method of forming a self-aligned guard ring of a photo diode according to a first embodiment of the present invention. As shown in FIG. 2, a semiconductor substrate such as a silicon on insulator (SOI) board or a semiconductor wafer 40 is provided. The semiconductor wafer 40 includes a P-type substrate 42 and a plurality of isolation matters 44, such as shallow trench isolation (STI) or field oxide (FOX), formed in the P-type substrate 42 to define a location of a photo diode region 46. The surface of the P-type substrate 42 further includes a pad oxide 47 and a pad nitride 49. A silicon oxide layer is deposited on the surface of the P-type substrate 42, and a patterned photo resist 51 is used to define a location of a photo sensor 50 on the silicon oxide layer. An etch process is performed to etch the silicon oxide layer and the pad nitride 49 is used as an etch stop layer. Then a photo sensor mask 48 is formed on the surface of the P-type substrate 42.

Figure 3:
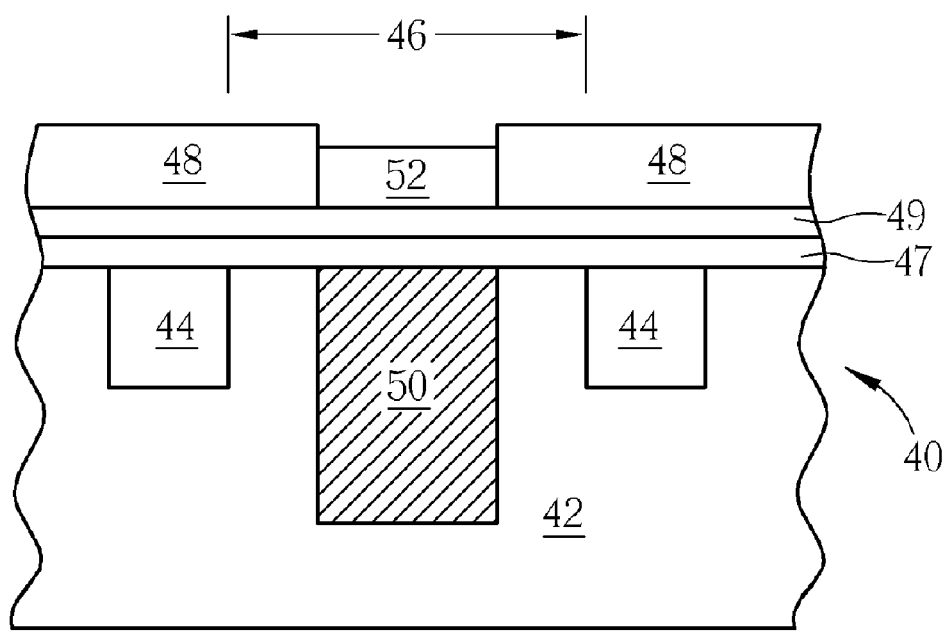
Figure 4:
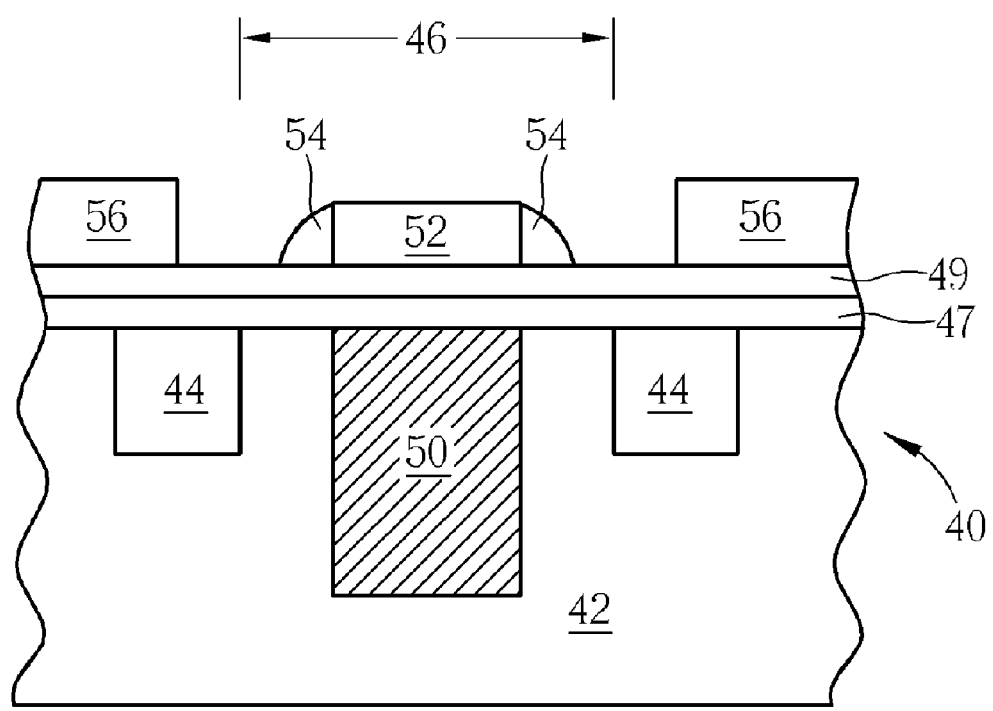

As shown in FIG. 3, a first ion implantation process is performed to implant N-type dopant to form a photo sensor 50 in the P-type substrate 42. A silicon nitride layer is deposited and an etch process is used to form a first mask 52 on the photo sensor 50. As shown in FIG. 4, the photo sensor mask 48 is removed, and a spacer 54 is formed around the first mask 52. A second mask 56 is formed with a photolithography process, and the second mask 56 exposes the photo diode region 46 and covers a part of the isolation matter 44.

Figure 5:
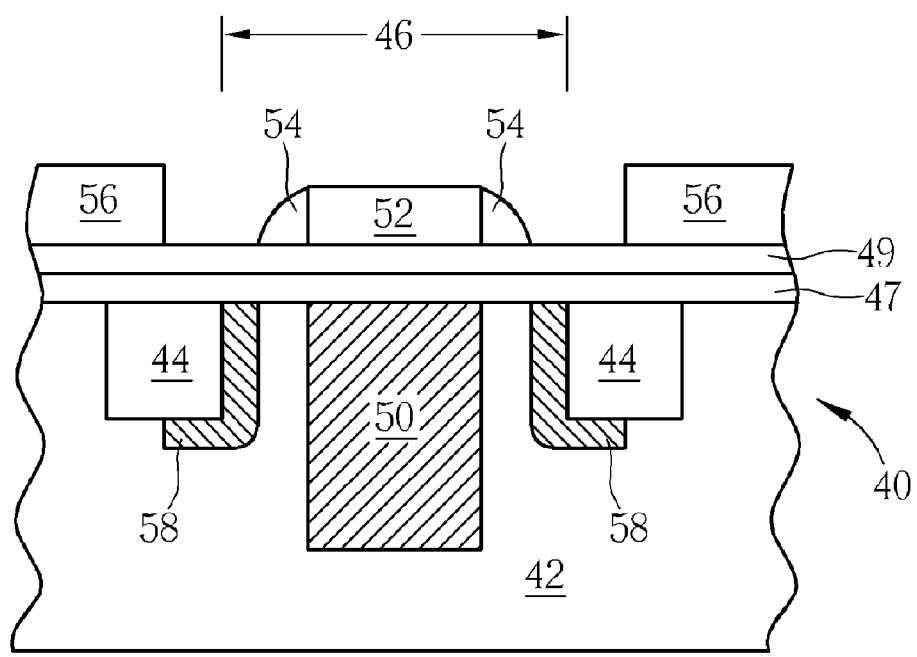
Figure 6:
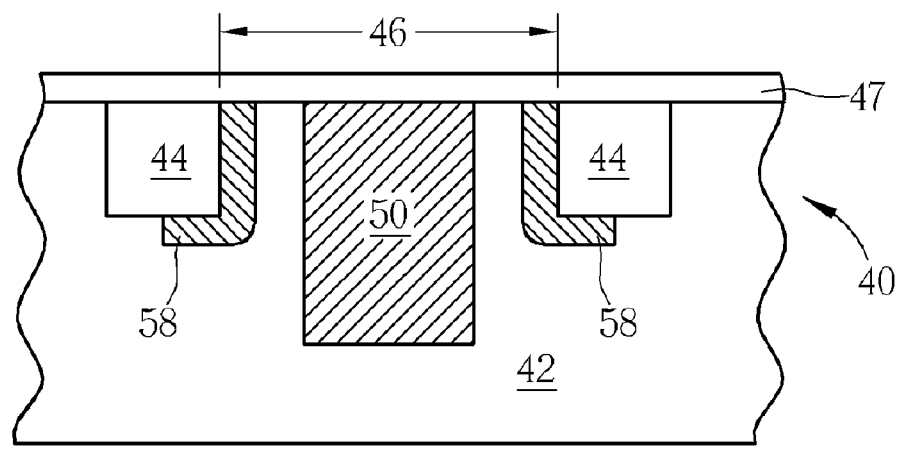

As shown in FIG. 5, utilizing the first mask 52, spacer 54, and second mask 56 as a block, a second ion implantation process is performed to implant P-type dopant to form a self-aligned guard ring 58 surrounding the photo sensor 50. The depth of the self-aligned guard ring 58 is greater than the depth of the isolation matter 44, and the self-aligned guard ring 58 covers a part of the isolation matter 44. At last, as shown in FIG. 6, the first mask 52, spacer 54, second mask 56, and the pad nitride 49 are removed, and the process of manufacturing a self-aligned guard ring of a photo diode of the present invention is completed.

In addition, it is to be noted that the first embodiment of the present invention may also use a selective deposition or selective oxidation process to uniformly increase the coverage area of the first mask 52 to substitute the function of the spacer 54. The photo sensor mask 48, pad nitride 49, first mask 52, spacer 54, and second mask 56 may also be formed by combining other oxides, nitrides, and polycrystalline silicon materials with photo resist, and only pattern transference and etch selectivity for each etch process need be paid particular attention. The abovementioned combinations and techniques are well known those well versed in the art.

Figure 7:
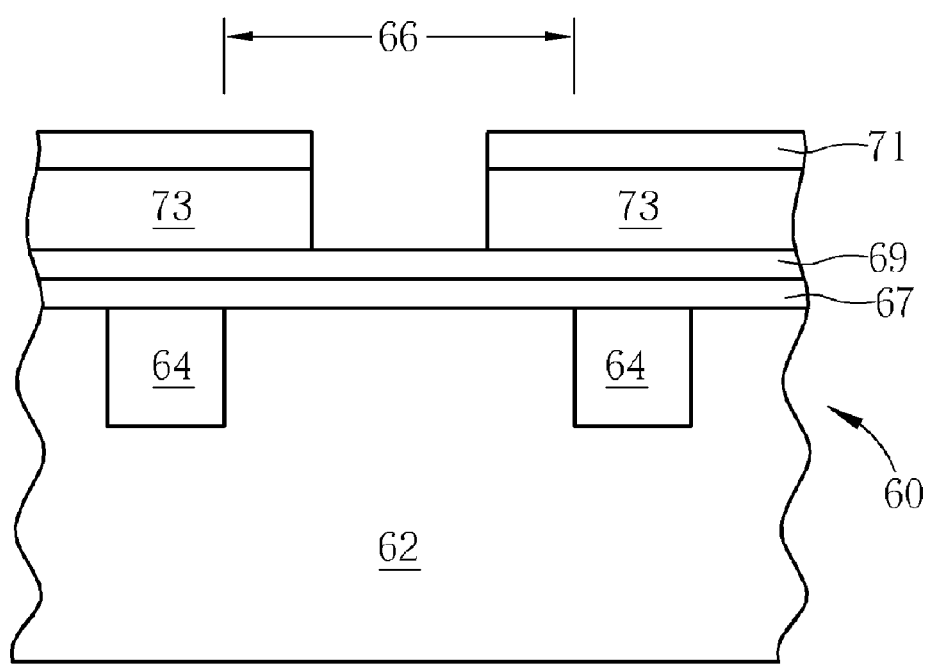
FIG. 7 to FIG. 12 are schematic diagrams for illustrating a method of forming a self-aligned guard ring of a photo diode according to a second embodiment of the present invention.
Figure 8:
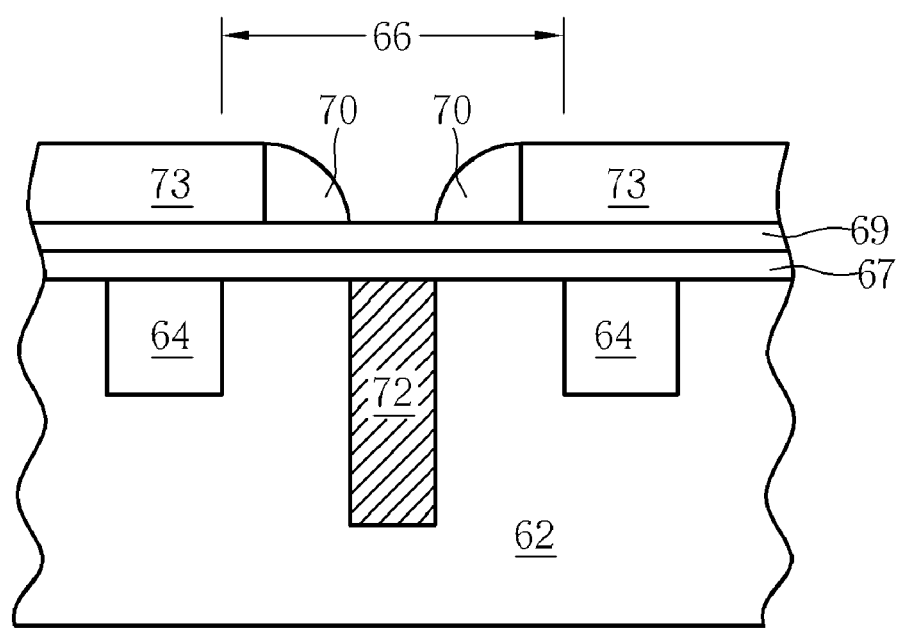

Please refer to FIG. 7 to FIG. 12. FIG. 7 to FIG. 12 are schematic diagrams for illustrating a method of forming a self-aligned guard ring of a photo diode according to a second embodiment of the present invention. As shown in FIG. 7, a semiconductor wafer 60 includes a P-type substrate 62 and a plurality of isolation matters 64, such as shallow trench isolation (STI) or field oxide (FOX), formed in the P-type substrate 62 to define a location of a photo diode region 66. The surface of the P-type substrate 62 further includes a pad oxide 67 and a pad nitride 69. A silicon oxide layer is deposited on the surface of the P-type substrate 62, and a patterned photo resist 71 is used to define a region which is wider than the location of a photo sensor 72 on the silicon oxide layer. An etch process is performed to etch the silicon oxide layer, and the pad nitride 69 is used as a etch stop layer. Then a first mask 73 is formed on the surface of the P-type substrate 62. A spacer 70 is formed around the first mask 73. Utilizing the first mask 73 and spacer 70 as a block, a first ion implantation process is performed to implant N-type dopant to form a photo sensor 72 in the P-type substrate 62.

Figure 9:
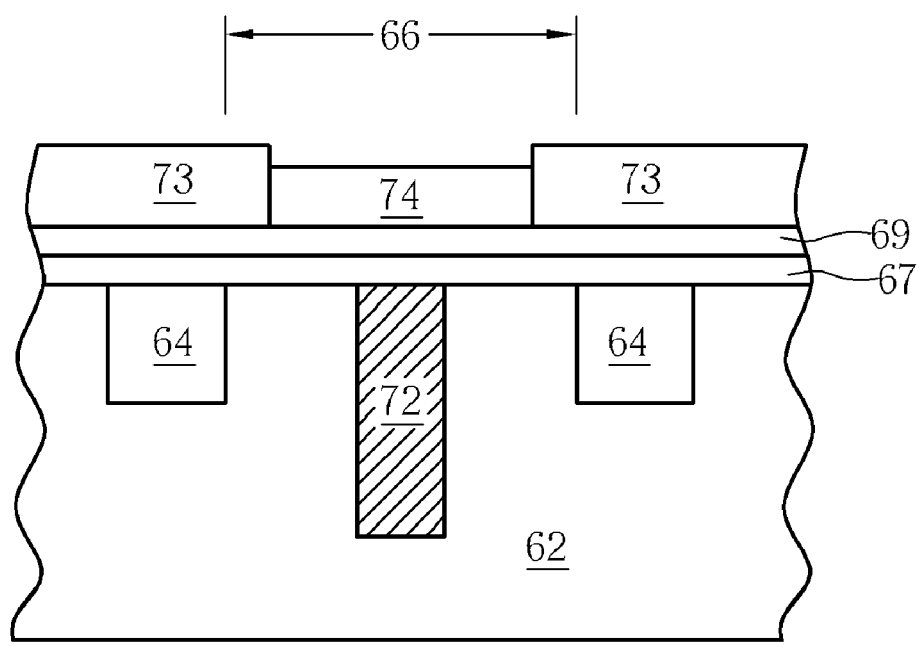
Figure 10:
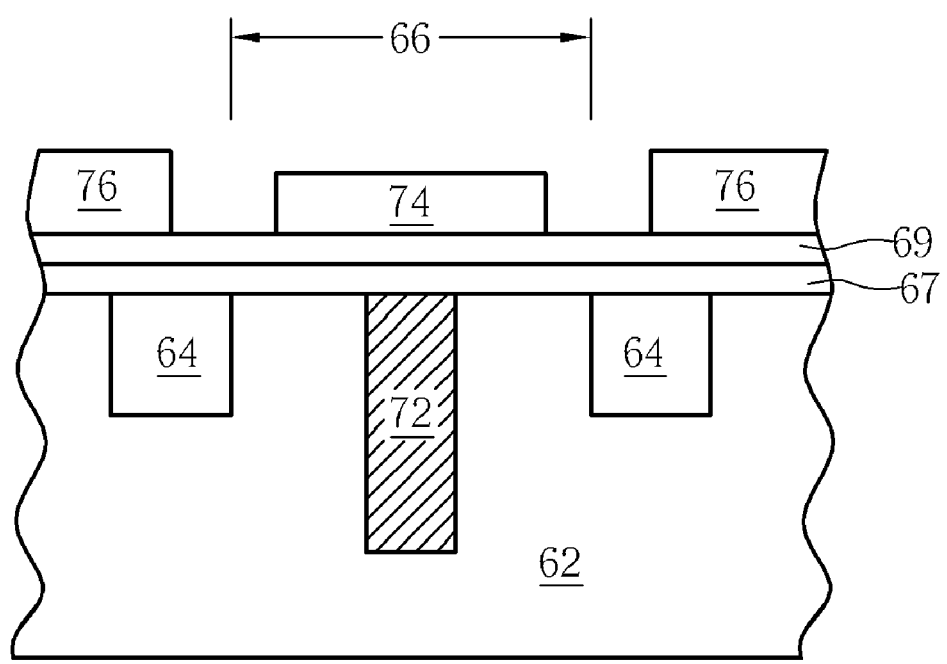

As shown in FIG. 9, the spacer 70 is removed, then a nitride silicon layer is deposited and an etch process is used to form a second mask 74 on the P-type substrate 62. As shown in FIG. 10, the first mask 73 is taken off and a third mask 76 is formed with a photolithography process, and the third mask 76 exposes the photo diode region 66 and covers a part of the isolation matter 64.

Figure 11:
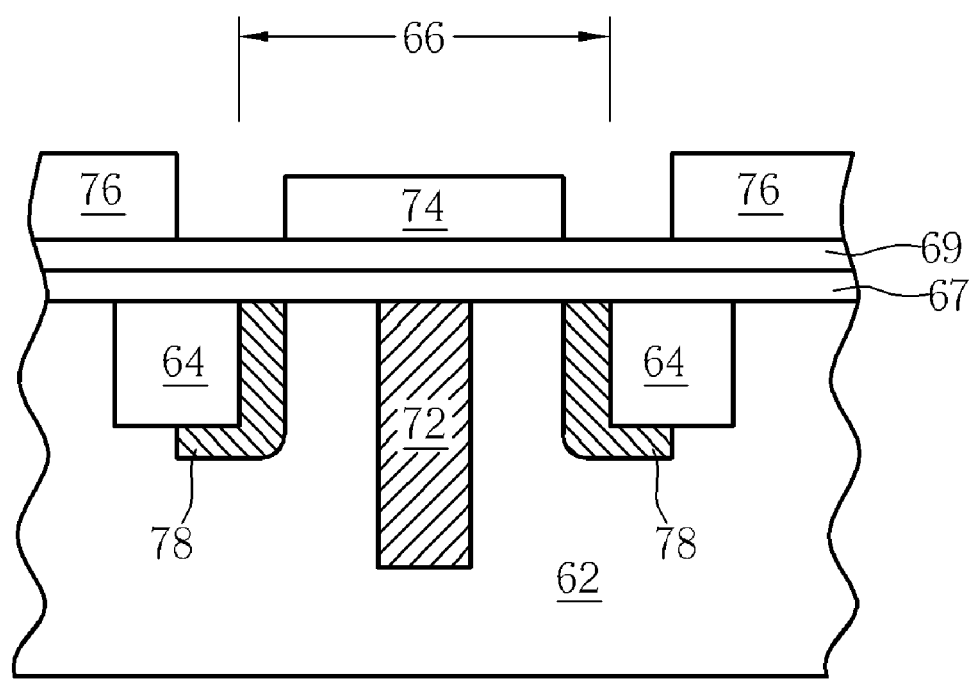
Figure 12:
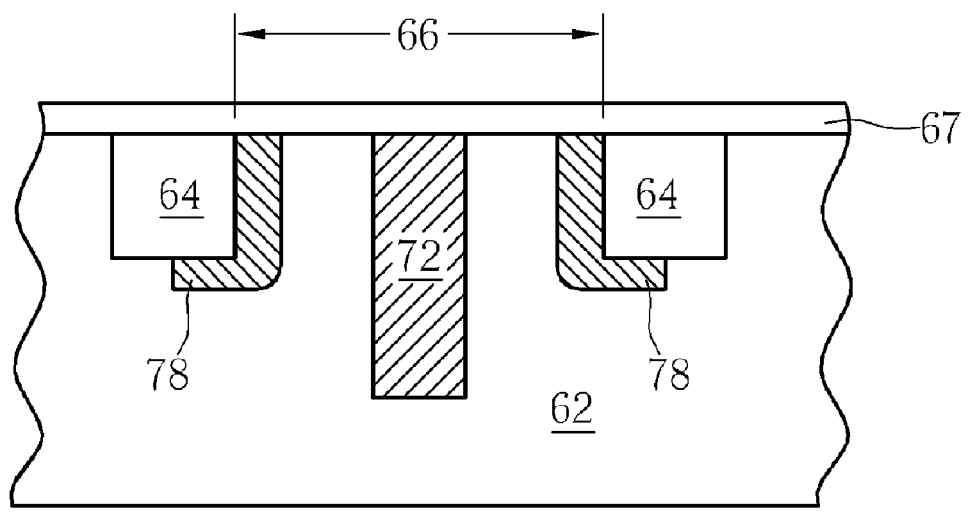

As shown in FIG. 11, utilizing the second mask 74 and third mask 76 as a block, a second ion implantation process is performed to implant P-type dopant to form a self-aligned guard ring 78 surrounding the photo sensor 72. The depth of the self-aligned guard ring 78 is greater than the depth of the isolation matter 64, and the self-aligned guard ring 78 covers a part of the isolation matter 64. Finally, as shown in FIG. 12, the second mask 74, third mask 76, and pad nitride 69 are removed, and the process of manufacturing a self-aligned guard ring of a photo diode of the present invention is completed.

It is to be noted that the step of the second embodiment according to the present invention, stating that:

"a first mask 73 is formed on the surface of the P-type substrate 62. A spacer 70 is formed around the first mask 73. Utilizing the first mask 73 and spacer 70 as a block, a first ion implantation process is performed to implant N-type dopant to form a photo sensor 72 in the P-type substrate 62. The spacer 70 is removed, then a nitride silicon layer is deposited, and an etch process is used to form a second mask 74 on the P-type substrate 62", may be substituted with the following step stating that:

"a first mask is formed to define the region of the photo sensor 72. A first ion implantation process is performed to implant N-type dopant to form a photo sensor 72 in the P-type substrate 62. An isotropic etch process is used to uniformly shrink the covering area of the first mask. A mask as the second mask 74 of the second embodiment is formed by applying a deposition and etch process."

Furthermore, the pad nitride 69, first mask 73, spacer 70, second mask 74, and third mask 76 may also be formed by combining other oxides, nitrides, and polycrystalline silicon materials with photo resist, and only pattern transference and etch selectivity for each etch process need to be paid particular attention. The abovementioned combinations and techniques are well known by those well versed in the art.

Furthermore, the method of manufacturing a self-aligned guard ring of a photo diode of the present invention may be applied to the manufacture of other devices.

In comparison with the prior art, the present invention utilizes a self-aligning technique to manufacture the photo diode guard ring. The present invention is useful in terms of size reduction of the semiconductor circuit, and is capable of avoiding contact between the depletion region and the high stress and high defect density region, decreasing the dark current to increase the photo sensor sensitivity of the photo diode, and increasing the characteristic uniformity of each photo diode.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a self-aligned guard ring of a photo diode comprising:

providing a semiconductor substrate with a photo diode region defined on the semiconductor substrate, and an isolation matter surrounding the photo diode region;

forming a photo sensor mask on the semiconductor substrate;

utilizing the photo sensor mask as a block for performing a first ion implantation process to create a photo sensor inside the photo diode region in the semiconductor substrate;

forming a first mask on the photo sensor;

removing the photo sensor mask;

forming a spacer around the first mask;

forming a second mask on the isolation matter outside edge and the second mask exposing the photo diode region;

utilizing the first mask, the spacer, and the second mask as a block for performing a second ion implantation process to create a self-aligned guard ring surrounding the photo sensor; and removing the first mask, the spacer, and the second mask.

2. The method of claim 1, wherein the isolation matter comprises a shallow trench isolation (STI) and a field oxide (FOX).

3. The method of claim 1, wherein the photo sensor mask covers the isolation matter and exposes a part of the photo diode region.

4. The method of claim 1, wherein the first ion implantation process implants N type dopant, and the second ion implantation process implants P type dopant.

5. The method of claim 1, wherein the depth of the self-aligned guard ring is greater than the depth of the isolation matter, and the self-aligned guard ring covers a part of the isolation matter.

6. The method of claim 1, wherein the semiconductor substrate further comprises at least a pad layer, and the masks are all formed on the pad layer.

7. A method of manufacturing a self-aligned guard ring of a photo diode comprising:
providing a semiconductor substrate with a photo diode region defined on the semiconductor substrate, and an isolation matter surrounding the photo diode region;
forming a first mask on the semiconductor substrate covering the isolation matter and exposing a part of the photo diode region;
forming a spacer around the first mask;
utilizing the first mask and the spacer as a block for performing a first ion implantation process to create a photo sensor inside the photo diode region in the semiconductor substrate;
removing the spacer;
forming a second mask on the semiconductor substrate where the semiconductor substrate is not covered by the first mask, and then removing the first mask;
forming a third mask on the isolation matter outside edge and the third mask exposing the photo diode region;
utilizing the second mask and the third mask as a block for performing a second ion implantation process to create a self-aligned guard ring surrounding the photo sensor; and
removing the second mask and the third mask.

8. The method of claim 7, wherein the isolation matter comprises a shallow trench isolation (STI) and a field oxide (FOX).

9. The method of claim 7, wherein the first ion implantation process implants N type dopant, and the second ion implantation process implants P type dopant.

10. The method of claim 7, wherein the depth of the self-aligned guard ring is greater then the depth of the isolation matter, and the self-aligned guard ring covers a part of the isolation matter.

11. The method of claim 7, wherein the semiconductor substrate further comprises at least a pad layer, and the masks are all formed on the pad layer.

12. A method of manufacturing a self-aligned guard ring comprising:
providing a semiconductor substrate with at least a device region defined on the semiconductor substrate;
forming a first mask on the semiconductor exposing a part of the device region;
forming a second mask on the semiconductor substrate where the semiconductor substrate is not covered by the first mask;
removing the first mask;
uniformly increasing the covering area of the second mask;
forming a third mask on the surface of the semiconductor substrate and the third mask exposing the device region and the second mask;
utilizing the second mask and the third mask as a block for performing a first ion implantation process to create a self-aligned guard ring; and
removing the second mask and the third mask.

13. The method of claim 12, wherein the device region is a photo diode region, and the semiconductor substrate further comprises an isolation matter surrounding the photo diode region.

14. The method of claim 13 further comprising a second ion implantation process after the first mask is formed for creating a photo sensor inside the photo diode region in the semiconductor substrate.

15. The method of claim 14, wherein the first ion implantation process implants P type dopant, and the second ion implantation process implants N type dopant.

16. The method of claim 13, wherein the isolation matter comprises a shallow trench isolation (STI) and a field oxide (FOX).

17. The method of claim 13, wherein the depth of self-aligned guard ring is greater then the depth of the isolation matter, and the self-aligned guard ring covers a part of the isolation matter.

18. The method of claim 12, wherein the semiconductor substrate further comprises at least a pad layer, and the masks are all formed on the pad layer.

19. A method of manufacturing a self-aligned guard ring comprising:
providing a semiconductor substrate with at least a device region defined on the semiconductor substrate;
forming a first mask on the semiconductor exposing a part of the device region;
uniformly shrinking the covering area of the first mask;
forming a second mask on the semiconductor substrate where the semiconductor substrate is not covered by the first mask;
removing the first mask;
forming a third mask on the surface of the semiconductor substrate and the third mask exposing the device region and the second mask;
utilizing the second mask and the third mask as a block for performing a first ion implantation process to create a self-aligned guard ring; and
removing the second mask and the third mask.

20. The method of claim 19, wherein the device region is a photo diode region, and the semiconductor substrate further comprises an isolation matter surrounding the photo diode region.

21. The method of claim 20 further comprising a second ion implantation process after the first mask is formed for creating a photo sensor inside the photo diode region in the semiconductor substrate.

22. The method of claim 21, wherein the first ion implantation process implants P type dopant, and the second ion implantation process implants N type dopant.

23. The method of claim 20, wherein the isolation matter comprises a shallow trench isolation (STI) and a field oxide (FOX).

24. The method of claim 20, wherein the depth of self-aligned guard ring is greater then the depth of the isolation matter, and the self-aligned guard ring covers a part of the isolation matter.

25. The method of claim 12, wherein the semiconductor substrate further comprises at least a pad layer, and the masks are all formed on the pad layer.

* * * * *